US006991476B2

(12) United States Patent
Koerwer et al.

(10) Patent No.: US 6,991,476 B2
(45) Date of Patent: Jan. 31, 2006

(54) ELECTRICAL COMPONENT OF A MOTOR VEHICLE

(75) Inventors: Matthias Koerwer, Wuppertal (DE); Ingmar Hentsch, Wuppertal (DE); Frank Hegerfeld, Gelsenkirchen (DE)

(73) Assignee: Brose Schliesssysteme GmbH & Co. KG, Wuppertal (DE)

( * ) Notice: Subject to any disclaimer, the term of this patent is extended or adjusted under 35 U.S.C. 154(b) by 0 days.

(21) Appl. No.: 10/855,956

(22) Filed: May 28, 2004

(65) Prior Publication Data

US 2005/0026470 A1 Feb. 3, 2005

(30) Foreign Application Priority Data

Jun. 2, 2003 (DE) .......................... 203 13 457 U

(51) Int. Cl.
*H01R 12/00* (2006.01)
*H05K 1/00* (2006.01)

(52) U.S. Cl. ........................ 439/76.2; 439/34; 439/949

(58) Field of Classification Search .................. 439/46, 439/503, 502, 76.2, 949, 34

See application file for complete search history.

(56) References Cited

U.S. PATENT DOCUMENTS

| | | | | |
|---|---|---|---|---|
| 5,501,605 | A * | 3/1996 | Ozaki et al. | 439/34 |
| 5,877,944 | A * | 3/1999 | Onizuka | 361/826 |
| 6,050,117 | A | 4/2000 | Weyerstall | |
| 6,220,874 | B1 * | 4/2001 | Kurata et al. | 439/76.2 |
| 6,494,722 | B1 * | 12/2002 | Sakamoto et al. | 439/76.2 |
| 6,513,959 | B2 * | 2/2003 | Serizawa et al. | 362/490 |
| 6,577,025 | B2 * | 6/2003 | Hentschel et al. | 307/10.1 |
| 6,582,239 | B2 * | 6/2003 | Ozawa | 439/76.2 |
| 6,707,689 | B2 * | 3/2004 | Momota et al. | 361/833 |

FOREIGN PATENT DOCUMENTS

| | | |
|---|---|---|
| DE | 195 45 722 A1 | 4/1997 |
| DE | 101 01 493 A1 | 8/2002 |

* cited by examiner

*Primary Examiner*—Hae Moon Hyeon
(74) *Attorney, Agent, or Firm*—Nixon Peabody LLP; David S. Safran

(57) ABSTRACT

This invention relates to an electrical component of a motor vehicle, the electrical component. The electrical component includes control electronics and at least one plug-and-socket connection for electrical connection of the electrical component to a coordinating control or another electrical component. The plug and socket connection further includes a plug, a plug housing and a connecting line. The plug-and-socket connection is detachably connectable, on one end, to a plug receptacle and wherein at least part of the control electronics is housed in the plug-and-socket connection.

45 Claims, 7 Drawing Sheets

ELECTRICAL COMPONENT OF A MOTOR VEHICLE

BACKGROUND OF THE INVENTION

1. Field of the Invention

The invention relates to an electrical component of a motor vehicle, and more specifically, to a plug-and-socket connection of an electrical component of a motor vehicle.

2. Description of Related Art

Electrical components of a motor vehicle enable increasingly more complex electrically actuated functions. One example is a motor vehicle door lock which is an electrical lock discussed in published German Patent Application DE 195 45 722 A1 which, in addition to conventional locking functions, enables motorized lifting of the ratchet. The coordination of these functions is assumed by a central control. The cost of the cabling between the control and the actuator or sensors and between the control and the outside door handles is considerable.

In order to make the described complexity of the electrical components managable, both with respect to the scope of operation and also with respect to the resulting cabling cost, there is an increasing trend toward decentralization of the control of the electrical components and using bus systems for the necessary electrical coupling.

One example describing the aforementioned decentralization of control in a motor vehicle with different electrical components such as motor vehicle door locks, window raisers or electrically adjustable outside mirrors is shown by published German Patent Application DE 101 01 493 A1. Each electrical component is equipped with its own control electronics and with a connection means for electrical coupling to a bus system. The connection means is generally made as a plug-and-socket connection so that a detachable connection of the electrical components to the bus system is possible. The control electronics of the electrical components, which form the starting point of the present invention and which are described here, can be made as a sequence control system, as a bus connection, as a power end stage for triggering actuators or the like.

While the cabling cost and the complexity of the control are reduced overall with the aforementioned decentralization, disadvantages arise with respect to the generally required diversity of versions with regard to the producibility of the electrical components. Also, due to the integrated decentralized control electronics, differences with respect to the respective control electronics must also be taken into account. Furthermore, by integration of the control electronics into the electrical component, the complexity of production is increased since expensive measures must be provided in the production line to protect sensitive electronic components.

Finally, when the control electronics which have been integrated into the electrical component fail, replacing the entire electrical component is usually not avoided, thereby leading to high costs.

SUMMARY OF THE INVENTION

A primary object of the present invention is to embody and develop the known electrical component of a motor vehicle such that the implementation of a decentralized control concept is optimized both with respect to production engineering and also later maintenance work.

The aforementioned object is achieved in an electrical component that includes control electronics and at least one plug-and-socket connection for electrical connection of the electrical component to a coordinating control or another electrical component. The plug and socket connection further includes a plug, a plug housing and a connecting line. The plug-and-socket connection is detachably connectable, on one side, to a plug receptacle and wherein at least part of the control electronics is housed in the plug-and-socket connection.

Another object of the invention includes the control electronics of the electrical component being housed in the plug-and-socket connection and thus otherwise is implemented separately from the electrical component.

The separate implementation of the control electronics and the electrical component also enables correspondingly separate production of the control electronics. It is advantageous here that "mixed" production, with electrical and electronic components on the one hand and mechanical components on the other, is avoided. This applies especially, in the preferred embodiment, to the integration of all the control electronics of the electrical component into the plug-and-socket connection. Then part of the electrical component does not have control electronics so that the production of this part of the electrical component is purely mechanical. The described, cost-intensive measures relating to control electronics in the production line are thereby eliminated.

Furthermore, the separate implementation of the control electronics and the electrical component otherwise, for the case of a repair, yields the possibility of replacement of the control electronics or of some of the control electronics by replacement of the plug-and-socket connection with another identical plug-and-socket connection.

By replacing the plug-and-socket connection with another plug-and-socket connection having different control electronics, it is also possible to change the scope of operation of the electrical component solely by replacing the plug-and-socket connection (especially to expand it, e.g., by parameterization of the electrical component). In this way, the diversity of versions which is generally required can be implemented without otherwise having to change the electrical component in a manner specific to the version.

As a result, the accommodation of at least part of the control electronics of the electrical component in the plug-and-socket connection leads to easy production and to interchangeability of the control electronics, to simple parameterization of the electrical component and to the capacity of the control electronics to be modified or retrofitted.

There are a host of possibilities for embodying and developing the teaching of the invention. The preferred embodiments offer a wide spectrum of possible implementation of the proposed concept. Additional freedom in the parameterization of the electrical component arises, especially when the part of the control electronics which is housed in the plug-and-socket connection is accommodated in or on the plug of the plug-and-socket connection and also in the connecting line which is preferably made as a FPC line (flexible printed circuit line).

According to another teaching which likewise acquires independent importance, the aforementioned object is achieved by a plug-and-socket connection of an electrical component of a motor vehicle for electrical connection of the electrical component to the coordinating control or another electrical component, the electrical component having control electronics. The plug and socket connection includes a plug, a plug housing, and a connecting line, wherein the plug-and-socket connection is detachably connectable, on one side, to a plug receptacle and wherein at least part of the control electronics is housed in the plug-and-socket connection.

The invention is explained in detail below using the accompanying drawings which show simply one embodiment of the invention.

DETAILED DESCRIPTION OF THE INVENTION

Figure 1:
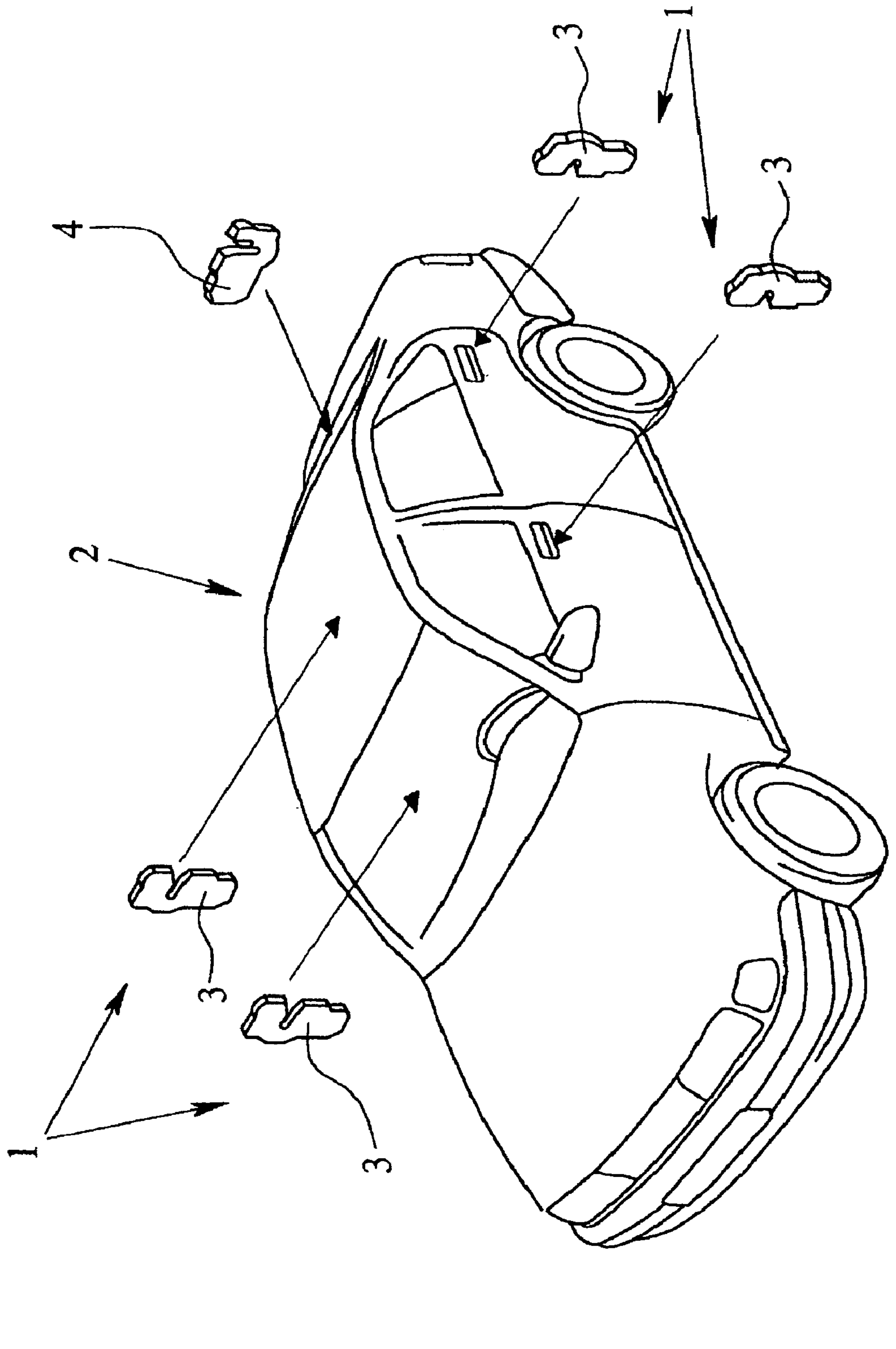
FIG. 1 shows in a schematic and perspective a motor vehicle with a motor vehicle door locking system, FIG. 2 schematically shows the structure of a motor vehicle door lock of the motor vehicle door locking system as shown in FIG. 1.

In the drawings, FIG. 1 shows a motor vehicle 2 which is made with electrical components 1 of a motor vehicle door locking system. It should be pointed out that an electrical component here is defined as any electrically actuated functional unit of a motor vehicle. The electrical components 1 can include several motor vehicle door locks 3 and a hood lock 4, with installation positions shown schematically in FIG. 1. The motor vehicle door locks 3 can be locked and unlocked by a motor in the sense of a central interlock. Each motor vehicle lock 3, embodied as an electrical lock, also has the possibility of motorized opening. The lifting of a ratchet by means of an opening drive is not shown.

It is pointed out that the proposed approach is described below using electrical components of a motor vehicle door locking system as an example. But this is not to be understood restrictively. All conceivable electrical components 1 of a motor vehicle 2 are considered to be an electrical component 1 in this sense. Examples include motor vehicle door locks, window raisers, seat height adjustments, or the like.

Figure 2:
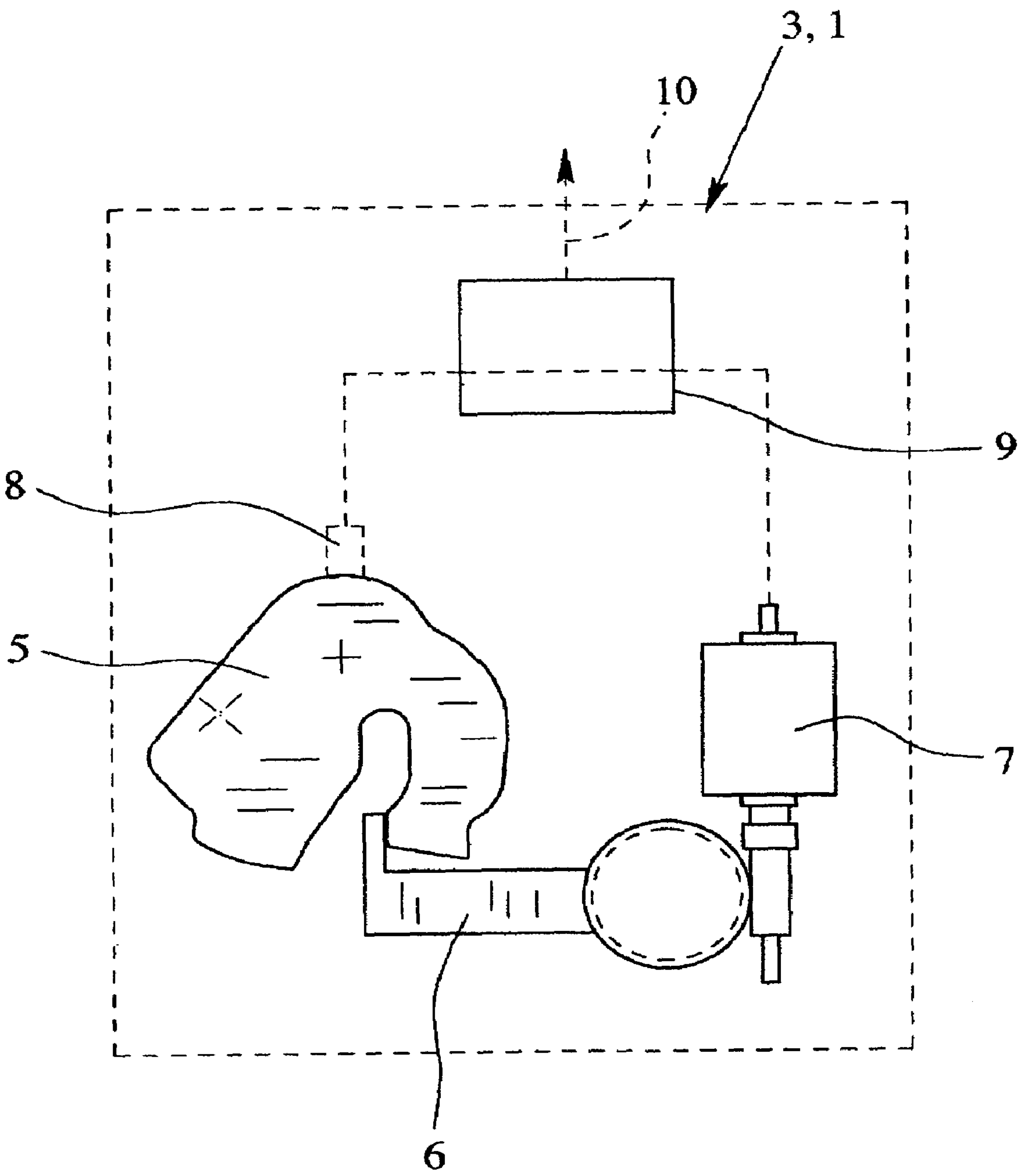
Fig. 2 (Prior Art)
Figure 3:
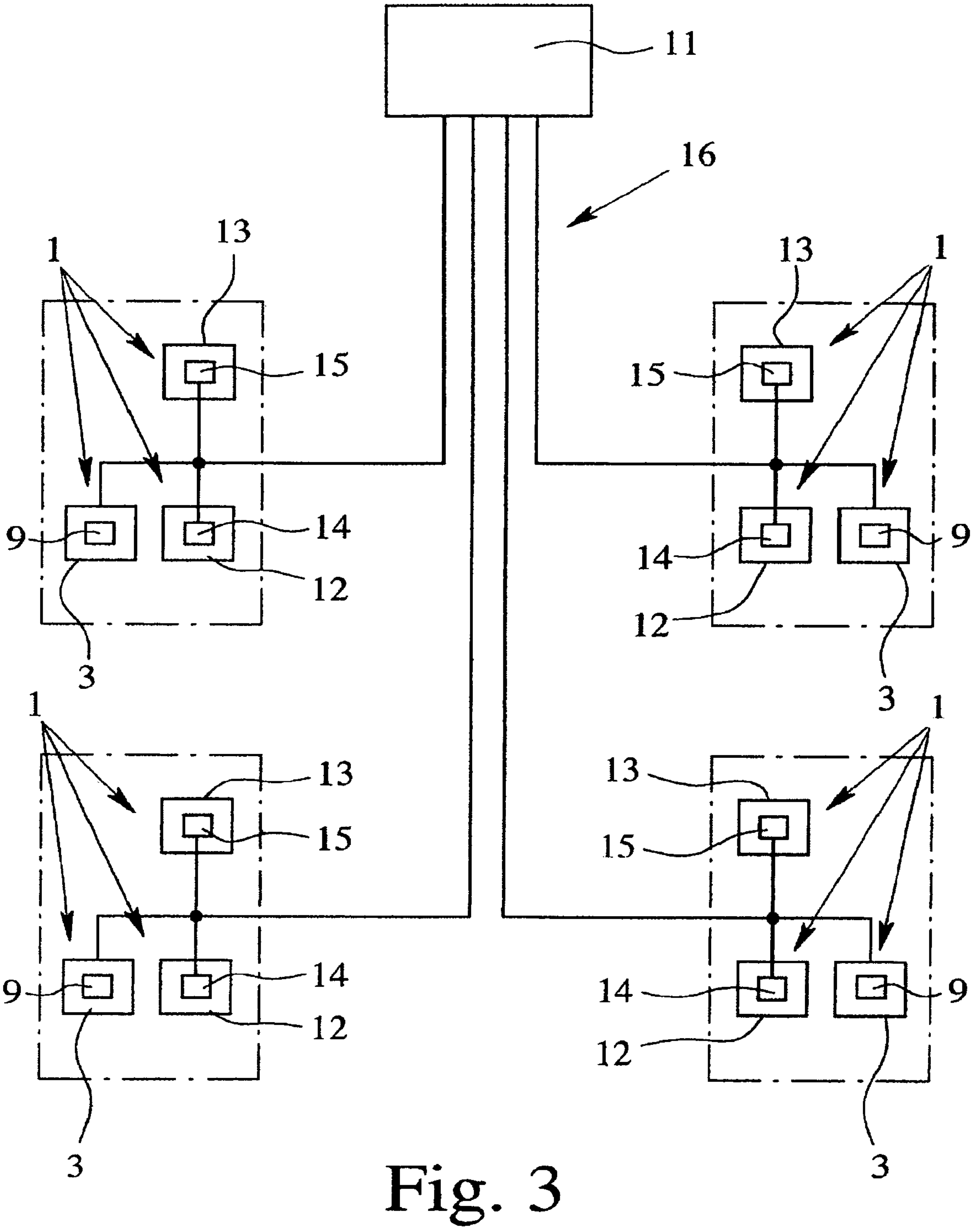
FIG. 3 shows, in a block diagram, the motor vehicle door locking system as shown in FIG. 1.
Figure 4:
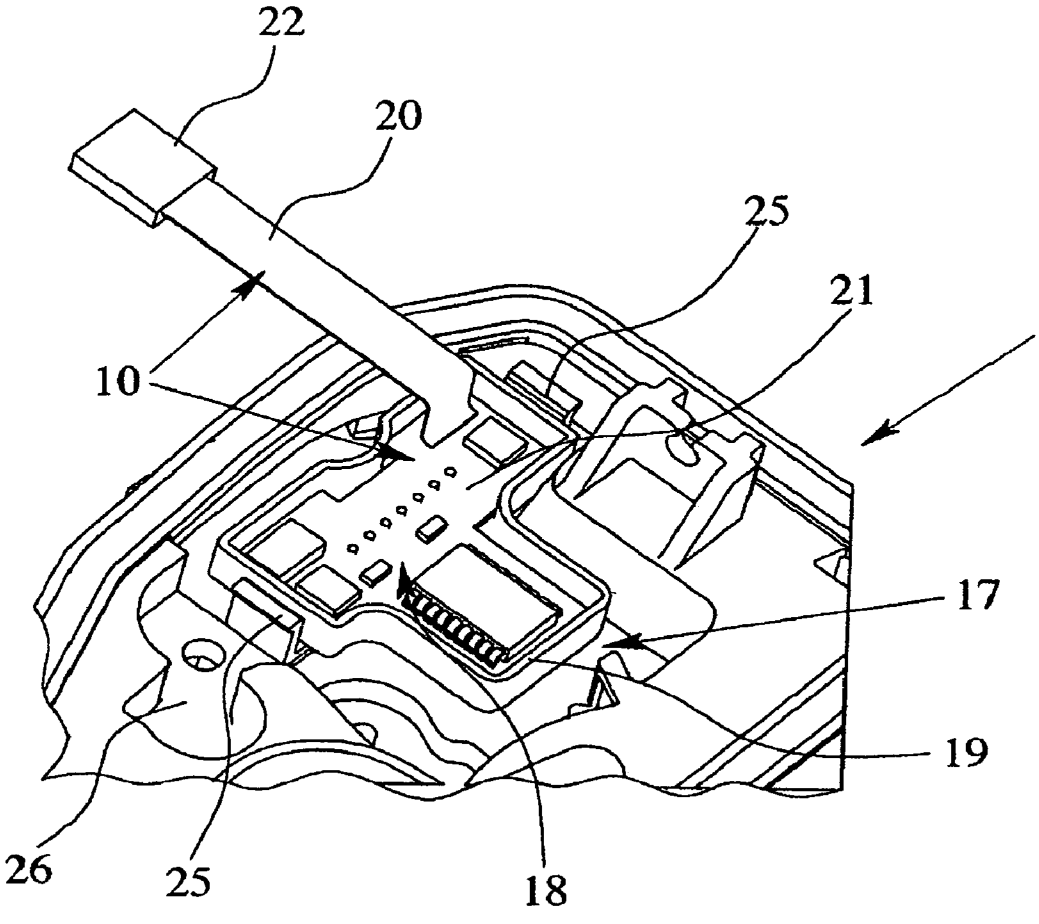
FIG. 4 is a schematic perspective view of a portion of the motor vehicle door lock of the motor vehicle door locking system as shown in FIG. 1.

FIG. 2 shows a conventional configuration of one of the motor vehicle door locks 3 shown in FIG. 1 with a latch 5 and ratchet 6, where the ratchet 6 can be raised by a motor via an actuator 7. There is furthermore a sensor 8 for interrogation of the position of the latch 5. The motor vehicle door lock 3 (e.g., the electrical component 1 in this exemplary embodiment) has control electronics 9 for triggering, among others, the sensor 8 and the actuator 7. A connecting means made preferably as a plug-and-socket connection 10 which enables electrical connection of the motor vehicle door lock 3 to a coordinating control 11, shown in FIG. 3, is outlined in broken lines. FIG. 4, discussed below, shows a schematic of the plug-and-socket connection 10.

FIG. 3 shows that, in each of the four illustrated door areas of the motor vehicle 2, there are several electrical components 1. In addition to the motor vehicle door lock 3 with the associated control electronics 9, a window raiser 12 and an electrically adjustable outside mirror 13 with the respectively pertinent control electronics 14, 15 are also shown. Furthermore, FIG. 3 shows that the electrical components 1 can be connected via a bus system 16, not only to the common control 11, but also to another electrical component 12, 13.

In a connected state, shown in FIG. 4, the plug-and-socket connection 10 is detachably connected, on one hand to the plug receptacle 17 on the electrical component 1. The plug-and-socket connection 10 has a plug 18, a plug housing 19 and a connecting line 20. Depending on the configuration of the electrical component 1, there can be more than one single plug-and-socket connection 10 for the connection of the electrical component 1 to a coordinating control 11 or another electrical component 12, 13. These statements apply to these other plug-and-socket connections 10 accordingly.

Figure 5:
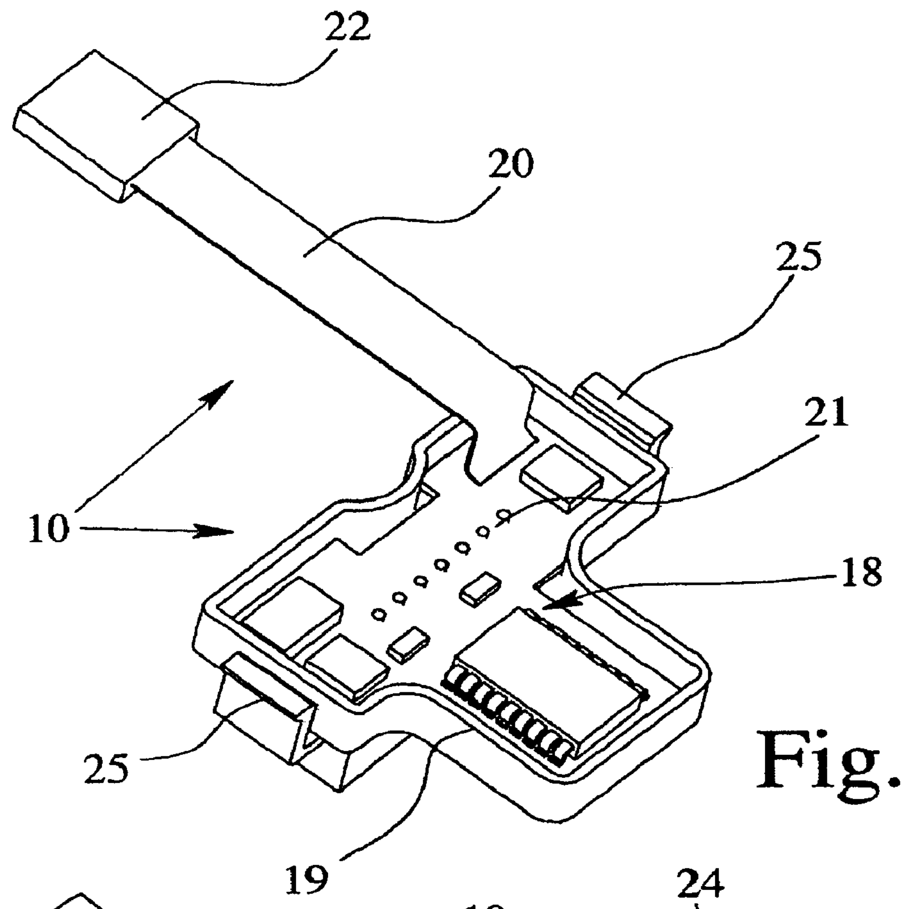
FIG. 5 is a schematic perspective view of a portion of the plug-and-socket connection of the motor vehicle door lock as shown in FIG. 4 from above.

It is important that at least part of the control electronics 9 of the electrical component 1, here of the motor vehicle door lock 3, is housed in the plug-and-socket connection 10. The part 21 of the control electronics 9 of the motor vehicle door lock 3 housed in the plug-and-socket connection 10 is shown in FIG. 5 in the form of a board with electronic components.

Especially with respect to optimum producibility of the electrical component 1, it is preferable that the entire control electronics 9 of the electrical component 1 is housed in the plug-and-socket connection 10. This results in that the part of the electrical component 1 which does not belong to the plug-and-socket connection 10 is made largely mechanical so that production is simplified, as explained above.

Depending on the application, different implementation possibilities for the connection of the electrical component 1 to the coordinating control 11 or to other electrical components 12, 13 are conceivable. In the embodiment shown in FIG. 4, the plug-and-socket connection 10 is detachably connected to the plug receptacle 17 where the plug receptacle 17 is a component of the electrical component 1. Thus, the plug-and-socket connection 10, directly on the electrical component 1, can be detached from the electrical component 1. The specific configuration of this connection is detailed below.

In the sense of the greatest possible flexibility it is preferably provided that the plug-and-socket connection 10, on both ends of the connecting line 20, has a plug 18, 22. The additional plug 22 likewise can hold a part of the control electronics 9 of the electrical component 1.

Figure 7:
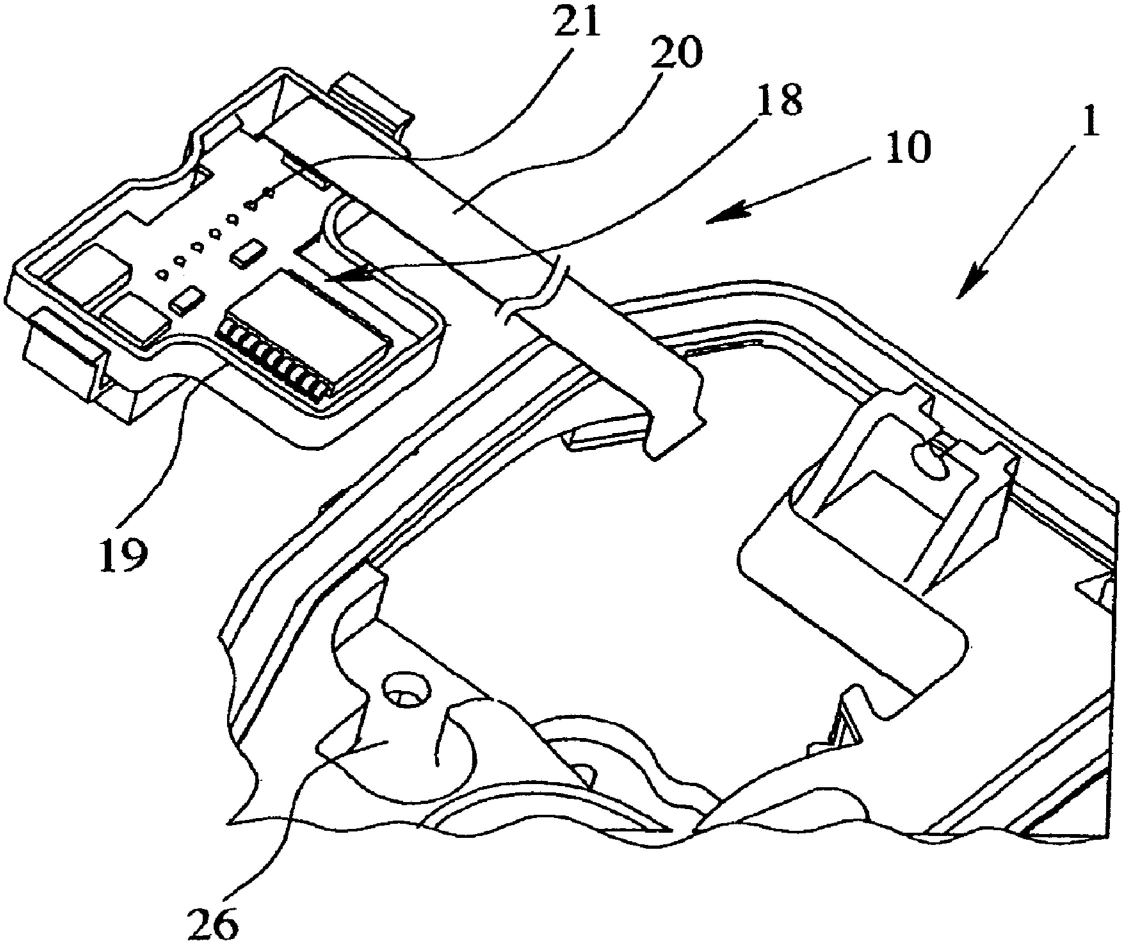
FIG. 7 shows a portion of the motor vehicle door lock as shown in FIG. 4, according to another embodiment of the present invention.

However, it can also be provided that, on the electrical component 1 itself, there is no plug receptacle 17, but that the connecting line 20 is permanently connected on one end to the electrical component 1 (FIG. 7). Here, "permanently" means that detachment of the connection without a tool or the like is not possible, for example, because the connection is a solder connection. Thus, the plug 18 of the plug-and-socket connection 10 is located on the correspondingly other end of the connecting line 20 so that the plug-and-socket connection 10 can be detachably connected to the coordinating control 11 or to the other electrical components 12, 13. The plug receptacle 17 is then not located on the electrical component 1, but on the coordinating control 11, on the other electrical component, on another plug-and-socket connection or the like.

With the latter two preferred embodiments, it becomes possible to provide at least part of the control electronics 9 of the electrical component 1 spatially separate from the electrical component 1, without the necessity of additional electrical connections. Finally, there can be a connection of the electrical component 1 to the coordinating control 11 or another electrical component. This spatial separation of the control electronics 9 from the electrical component 1 can otherwise be advantageous especially when the control electronics 9 is to be located in a dry space, for example, of a motor vehicle door, while the electrical component 1 is otherwise located in the wet space of the motor vehicle door.

In a preferred configuration, the control electronics 9 of the electrical component 1, (e.g., motor vehicle door lock 3) has a bus connection which is housed at least partially in the plug-and-socket connection 10. The bus connection can be preferably a LIN bus connection or a CAN bus connection. Other possible bus connections are also known which can be suitably employed.

In another preferred embodiment, the bus connection is housed completely in the plug-and-socket connection 10. This enables the connection of electrical component 1, which is not bus-capable, to a bus by making available the electronics necessary for this purpose (i.e., a bus connection) by the plug-and-socket connection 10. For example, where the bus connection is housed entirely in the plug-and-socket connection 10, there can be two versions of the electrical component 1. The first version providing for a connection of the electrical component 1 without a bus connection. Then, the plug-and-socket connection 10 is implemented in the conventional manner. In the second version, a bus connection is housed in the plug-and-socket connection 10 so that the electrical component 1 can thus be coupled to a bus system.

In another preferred embodiment, the control electronics 9 of the electrical component 1 has a power end stage for triggering actuators 7 which can be housed at least partially in the plug-and-socket connection 10. FIG. 2 shows such an actuator 7.

Furthermore, it is provided that the control electronics 9 of the electrical component 1 has sensor triggering member and that the sensor triggering member is housed at least partially in the plug-and-socket connection 10. FIG. 2 shows a sensor 8 which can be triggered by the aforementioned sensor triggering member.

There are a host of possibilities for which part of the control electronics 9 of the electrical component 1 is housed in the plug-and-socket connection 10. For the possible scope of operation of the control electronics 9 of the electrical component 1 reference should be made to the prior art.

FIG. 5 shows the preferred configuration that the part 21 of the control electronics 9 of the electrical component 1 (e.g., motor vehicle door lock 3), housed in the plug-and-socket connection 10, is housed at least partially in or on the plug 18 of the plug-and-socket connection 10. Basically, it is possible for the part 21 of the control electronics 9 housed in the plug-and-socket connection 10 to be located outside the plug housing 19 on the plug 19. In any case, the version is preferable in which the part 21 housed in the plug-and-socket connection 10 is housed at least partially in the plug housing 19.

Figure 8:
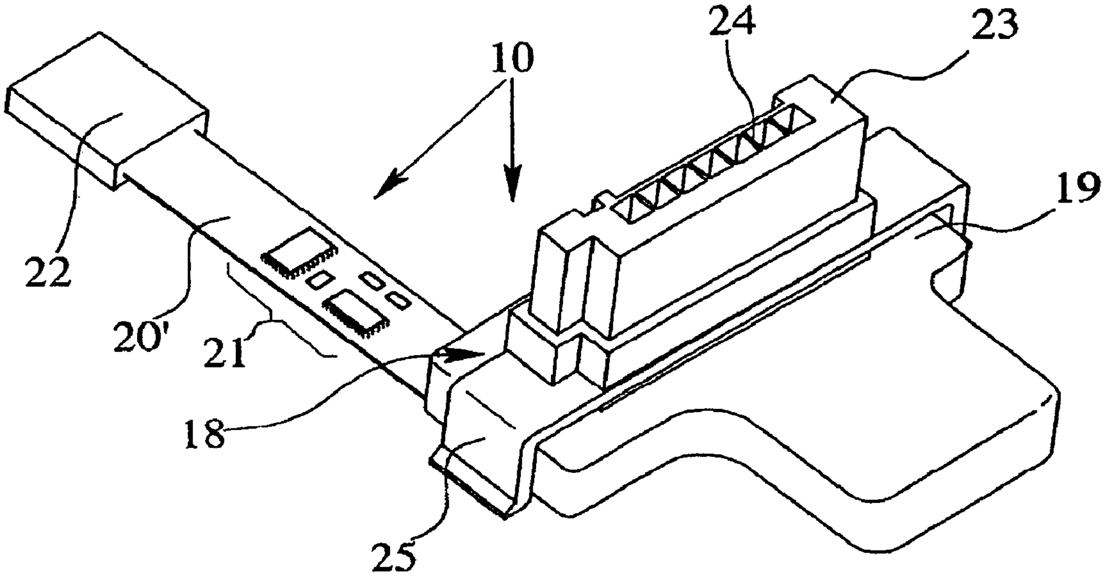
FIG. 8 is a schematic perspective view similar to that of FIG. 6, but showing a portion of another plug-and-socket connection.

In certain applications, it can also be advantageous for the part 21 of the control electronics 9 of the electrical component 1 housed in the plug-and-socket connection 10 to be housed at least partially in the connecting line 20' (FIG. 8) and, where applicable, to be housed partially in the plug 18. But, it can also be advantageous that, in the plug 18, there are no control electronics 9 at all so that the connecting line 20 completely accommodates the part 21 of the control electronics 9.

One possibility for housing the part 21 of the control electronics 9 in the connecting line is to make the connecting line 20 at least partially as a FPC line (flexible printed circuit line). A FPC line is a copper layout which is prepared using etching technology on a flexible foil. Here, outfitting with electronic and electromechanical components is possible so that integration of part 21 of the control electronics 9 can be easily implemented.

One especially favorable application for housing the part 21 of the control electronics 9 in the connecting line 20 arises in turn in a motor vehicle door with a dry space and a wet space. Here, it can be provided, for example, that the connecting line 20 is made on the dry space side as a multicore cable harness which has the above described integrated bus connection at the transition point from the dry space into the wet space. The bus connection, as described above, can be located in the connecting line 20, itself or on a plug 18. Thus, it is possible to "continue" the multicore cable harness in the wet space with a two-wire line or the like. The connecting line 20 can also be made from a known multi-core cable or a foil conductor.

The control electronics 9 provided in the plug 18 can be inserted into the plug 18 or potted in the plug 18. In the latter version, a connecting line 20, made as a foil conductor, can be potted directly with the control electronics 9. However, it can also be advantageous to make the connecting line 20 pluggable on the plug 18 so that a plug version 18 with different connecting lines 20 can be used.

Figure 6:
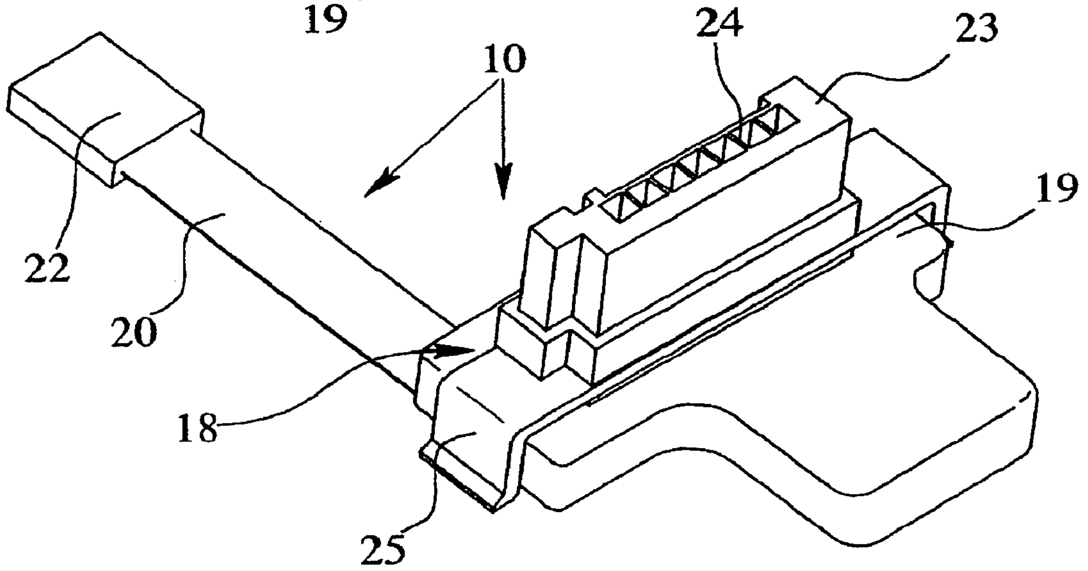
FIG. 6 is a schematic perspective of the plug-and-socket connection from FIG. 5 from below.

The plug 18 has a lengthwise guide 23, which is shown in FIG. 6, for the positive connection of the plug 18 to the plug receptacle 17. Within the lengthwise guide 23, there are plug contacts 24 of the plug 18.

In an especially preferred configuration, the plug 18 has at least one fastening element 25 for attachment of the plug 18 to the electrical component 1. In another preferred embodiment the fastening elements 25 directly engage the plug receptacle 17, as is shown in FIG. 4. For attaching the plug 18 to the plug receptacle 17 numerous possibilities are available from the prior art.

Depending on the configuration and the arrangement of the electrical component 1, it can be advantageous for the plug housing 19 to be made essentially watertight. Furthermore, it can be advantageous for the mechanical connection between the plug 18 and the plug receptacle 17 to also be watertight.

It is especially advantageous if the plug housing 19 in the connected state does not enlarge the installation space required for the electrical component 1 compared to the installation space required in the unconnected state. Therefore, plug 18 does not violate the installation space of the electrical component 1 and is to a certain extent an integral component of the housing 26 of the electrical component 1. This has advantages especially in retrofitting or modifying the electrical component 1, since by connecting the plug-and-socket connection 10 or by replacing the plug-and-socket connection 10 the external configuration of the electrical component 1 does not change noticeably with respect to mounting.

It is pointed out that the mechanical configuration of the plug-and-socket connection 10 is essential for the amount of flexibility which can be achieved with the proposed concept. For example, it is especially advantageous if a single mechanical version of the plug 18 (e.g. a universal adapter)

is provided for several motor vehicle locks. It is furthermore conceivable for the plug 18 to be made mechanically such that it is matched to already present plugs 18 and plug receptacles 17 and thus can be used for already existing electrical components 1.

It follows from the aforementioned that special advantages can be achieved when the electrical component 1 is a component of a motor vehicle door locking system, especially a motor vehicle door lock 3. The aforementioned advantages can, however, also be achieved for all other electrical components 1 present in the motor vehicle 2. One example of this resides in that the electrical component 1 is a motor vehicle seat (not shown) or a component of a motor vehicle seat, especially the arrangement for adjusting the seat height. Another preferred configuration calls for the electrical component 1 to be an electrical window raiser 12.

What is claimed is:

1. An electrical component of a motor vehicle, the electrical component comprising: control electronics for triggering at least one member of the electrical component; and at least one plug-and-socket connection for electrical connection of the electrical component to a coordinating control or another electrical component, the at least one plug and socket connection further comprising:

at least one plug;

at least one plug housing; and at least one connecting line connected to said plug housing, wherein the at least one plug-and-socket connection is detachably connectable, at least on one end via said at least one plug, to a plug receptacle and wherein at least a part of the control electronics is housed in at least one of a connecting line and a plug of the at least one plug-and-socket connection.

2. The electrical component as claimed in claim 1, wherein the plug receptacle is an element of the electrical component.

3. The electrical component as claimed in claim 2, wherein the plug housing, in the connected state, does not enlarge the installation space required for the electrical component compared to the installation space required in the unconnected state.

4. The electrical component as claimed in claim 1, wherein said at least one plug comprises a plug on each end of the connecting line of the plug-and-socket connection.

5. The electrical component as claimed in claim 1, wherein the connecting line can be detachably connected, with a plug-in capacity, to the at least one plug.

6. The electrical component as claimed in claim 1, wherein the control electronics of the electrical component has a bus connection, and wherein the bus connection is housed at least partially in the plug-and-socket connection.

7. The electrical component as claimed in claim 1, wherein the control electronics of the electrical component has a power end stage for triggering of actuators or the like, and wherein the power end stage is housed at least partially in the at least one plug-and-socket connection.

8. The electrical component as claimed in claim 1, wherein the control electronics of the electrical component has sensor triggering and wherein the sensor triggering is housed at least partially in the at least one plug-and-socket connection.

9. The electrical component as claimed in claim 1, wherein the part of the control electronics of the electrical component which is housed in the plug-and-socket connection is accommodated at least partially in or on the plug of the plug-and-socket connection.

10. The electrical component as claimed in claim 1, wherein the part of the control electronics of the electrical component which is housed in the plug-and-socket connection is accommodated at least partially on the connecting line.

11. The electrical component as claimed in claim 10, wherein the connecting line is made at least partially as a flexible printed circuit line.

12. The electrical component as claimed in claim 9, wherein the part of the control electronics of the electrical component which is housed on the at least one plug-and-socket connection is accommodated at least partially in the connecting line.

13. The electrical component as claimed in claim 12, wherein the connecting line is made at least partially as a flexible printed circuit line.

14. The electrical component as claimed in claim 1, wherein the plug has at least one fastening element for attachment of the plug to the plug receptacle of the electrical component.

15. The electrical component as claimed in claim 1, wherein the plug housing is essentially watertight.

16. The electrical component as claimed in claim 1, wherein the electrical component is a motor vehicle door lock of a motor vehicle door locking system.

17. The electrical component as claimed in claim 1, wherein the electrical component is a motor vehicle seat or a component of a motor vehicle seat.

18. The electrical component as claimed in claim 1, wherein the electrical component is an electrical window raiser.

19. The electrical component as claimed in claim 1, wherein the connecting line on one end is undetachably connected to the electrical component and on the other end has said plug.

20. The electrical component as claimed in claim 19, wherein the connecting line can be detachably connected with a plug-in capacity to the plug.

21. The electrical component as claimed in claim 19, wherein the control electronics of the electrical component has a bus connection, and wherein the bus connection is housed at least partially in the at least one plug-and-socket connection.

22. The electrical component as claimed in claim 19, wherein the control electronics of the electrical component has a power end stage for triggering actuators and wherein the power end stage is housed at least partially in the at least one plug-and-socket connection.

23. The electrical component as claimed in claim 19, wherein the control electronics of the electrical component further comprises sensor triggering, wherein the sensor triggering is housed at least partially in the at least one plug-and-socket connection.

24. The electrical component as claimed in claim 19, wherein the part of the control electronics of the electrical component housed on the at least one plug-and-socket connection is accommodated at least partially in or on the plug of the plug-and-socket connection.

25. The electrical component as claimed in claim 19, wherein the part of the control electronics of the electrical component which is housed on the at least one plug-and-socket connection is accommodated at least partially in the connecting line.

26. The electrical components as claimed in claim 25, wherein the connecting line is made at least partially as a flexible printed circuit line.

27. The electrical component as claimed in claim 24, wherein the part of the control electronics of the electrical component which is housed on the at least one plug-and-socket connection is accommodated at least partially in the connecting line.

28. The electrical component as claimed in claim 27, wherein the connecting line is made at least partially as a flexible printed circuit line.

29. The electrical component as claimed in claim 19, wherein the plug housing is essentially watertight.

30. The electrical component as claimed in claim 19, wherein the electrical component is a motor vehicle door lock of a motor vehicle door locking system.

31. The electrical component as claimed in claim 19, wherein the electrical component is a motor vehicle seat or a component of a motor vehicle seat.

32. The electrical component as claimed in claim 19, wherein the electrical component is an electrical window raiser.

33. A plug-and-socket connection of an electrical component of a motor vehicle for electrical connection of the electrical component to the coordinating control or another electrical component, the electrical component having control electronics for triggering at least one member of the electrical component, the plug and socket connection comprising:

at least one plug;

at least one plug housing; and at least one connecting line connected to said plug housing, wherein the plug-and-socket connection is detachably connectable, at least on one end via said at least one plug, to a plug receptacle and wherein at least a part of the control electronics is housed in at least one of a connecting line and a plug of the at least one plug-and-socket connection.

34. The plug-and-socket connection as claimed in claim 33, wherein said at least one plug comprises a plug on each end of the connecting line of the plug-and-socket connection.

35. The plug-and-socket connection as claimed in claim 33, wherein the connecting line can be detachably connected, with a plug-in capacity, to the plug.

36. The plug-and-socket connection as claimed in claim 33, wherein the control electronics of the electrical component has a bus connection, and wherein the bus connection is housed at least partially in the plug-and-socket connection.

37. The plug-and-socket connection as claimed in claim 33, wherein the control electronics of the electrical component has a power end stage for triggering of actuators and wherein the power end stage is housed at least partially in the plug-and-socket connection.

38. The plug-and-socket connection as claimed in claim 33, wherein the control electronics of the electrical component further comprises sensor triggering and wherein the sensor triggering is housed at least partially in the plug-and-socket connection.

39. The plug-and-socket connection as claimed in claim 33, wherein the part of the control electronics of the electrical component which is housed in the plug-and-socket connection is accommodated at least partially in or on the plug of the plug-and-socket connection.

40. The plug-and-socket connection as claimed in claim 33, wherein the part of the control electronics of the electrical component which is housed on the plug-and-socket connection is accommodated at least partially in the connecting line.

41. The plug-and-socket connection as claimed in claim 40, wherein the connecting line is made at least partially as a flexible printed circuit line.

42. The plug-and-socket connection as claimed in claim 39, wherein the part of the control electronics of the electrical component which is housed in the plug-and-socket connection is accommodated at least partially in the connecting line.

43. The plug-and-socket connection as claimed in claim 42, wherein the connecting line is made at least partially as a flexible printed circuit line.

44. The plug-and-socket connection as claimed in claim 33, wherein the plug has at least one fastening element for attachment of the plug to the electrical component.

45. The plug-and-socket connection as claimed in claim 33, wherein the plug housing is essentially watertight.

* * * * *